United States Patent [19]
Williams

[11] Patent Number: 5,502,405
[45] Date of Patent: Mar. 26, 1996

[54] METHOD AND APPARATUS FOR CML/EC TO CMOS/TTL TRANSLATORS

[75] Inventor: Bertrand J. Williams, Campbell, Calif.

[73] Assignee: Cypress Semiconductor Corporation, San Jose, Calif.

[21] Appl. No.: 335,908

[22] Filed: Nov. 8, 1994

[51] Int. Cl.[6] .............................................. H03K 19/0175
[52] U.S. Cl. .............................................. 326/66; 326/71
[58] Field of Search .......................... 326/63–66, 70–71, 326/76

[56] References Cited

U.S. PATENT DOCUMENTS

| | | | |
|---|---|---|---|
| 4,430,582 | 2/1984 | Bose et al. | 326/64 X |
| 4,471,242 | 9/1984 | Noufer et al. | 326/71 X |
| 4,642,488 | 2/1987 | Parker | 326/70 X |
| 4,845,381 | 7/1989 | Cuevas | 326/63 X |
| 5,304,869 | 4/1994 | Greason | 326/64 X |
| 5,315,179 | 5/1994 | Pelley, III et al. | 326/64 |
| 5,341,046 | 8/1994 | Crafts | 326/63 X |

*Primary Examiner*—David R. Hudspeth
*Attorney, Agent, or Firm*—Blakely, Sokoloff, Taylor & Zafman

[57] ABSTRACT

A translator for translating signals from a CML or ECL circuit to signals that are compatible with CMOS or TTL voltage levels is disclosed. The translator has minimum power consumption and provides switching and drive characteristics that are independent of the threshold voltage, power supply voltage, temperature and process variations. The translator includes the following components: a bias reference generator for receiving a first bias voltage and generating a second bias voltage; an input circuit for receiving the input signals; a cascode circuit for receiving the second bias voltage, having a controlled current and outputting the output signals; and a current-mirror circuit. The first bias voltage is at the mid-point of the logic swing of the input signals, and the bias reference generator provides the second bias voltage to generate the controlled current in the switching stage of the translator. A method for translating signals having CML or ECL logic voltage levels to signals having CMOS or TTL logic voltage levels includes the following steps: receiving a first bias voltage that is substantially in the mid-point of the logic swing of the input signals; providing a second bias voltage to a cascode circuit for producing a controlled current in the cascode circuit; receiving the input signals; switching the cascode circuit; and producing the output signals.

17 Claims, 3 Drawing Sheets

METHOD AND APPARATUS FOR CML/EC TO CMOS/TTL TRANSLATORS

BACKGROUND OF THE INVENTION

1. Field of the Invention

The present invention relates to Bipolar Complementary Metal Oxide Semiconductor ("BiCMOS") processes and circuits created by such processes and more specifically for translating an output signal from a Current-Mode Logic ("CML") or an Emitter-Coupled Logic ("ECL") circuit to a signal that is compatible with CMOS or Transistor-Transistor Logic ("TTL") voltage levels.

2. Description of the Related Art

In high performance digital logic designs, speed and power are two of the most commonly used criteria for technology selection. Although the power dissipation in CMOS circuits implemented with CMOS Field Effect Transistors ("FETs") is very low, this is only true for CMOS circuits that are not switching at high speed rates. When CMOS circuits are fixed at a logic level, they do not conduct current, and therefore negligible power is consumed. But when a CMOS circuit is switching from one logic state to another, current flows briefly and power is consumed. Therefore, the lower speed logic may be designed with CMOS transistors to reduce the power consumption. The typical low logic level voltage for CMOS circuits is Vss, and the typical high logic level voltage for CMOS circuits is Vcc, where Vcc is typically a voltage between 3 V and 15 V, and Vss is typically ground. In the case of a TTL circuit, the low logic level voltage is Vss, and the high logic level voltage is Vcc minus a diode voltage drop. The power supply Vcc for TTL circuit is usually 5 V.

A faster speed logic may be designed with CML or ECL to improve circuit performance. CML uses non-saturating current-mode bipolar logic and can be implemented by limiting the current and voltage swings to ensure only active-mode bipolar junction transistor ("BJT") operation. Rather than being constructed around transistors that operate as simple "on" or "off" devices, the CML transistors are designed to operate at two different "on" conditions at closely spaced voltage levels. Therefore, high performance digital logic designs typically utilize CML, including ECL which is a type of CML. A typical low logic level voltage of a CML is Vcc–0.4 V, and a high logic level voltage is Vcc. For an ECL circuit, the low logic level voltage is typically Vcc–1.4 V, and the high logic level voltage is Vcc–0.7 V.

To interface a CML or an ECL circuit with a CMOS or a TTL circuit, the output signal from the CML or ECL circuit must be transformed to a signal which is compatible with CMOS or TTL voltage levels. The translation requires a logic level translator that consumes a significant amount of DC power.

FIG. 1 shows a conventional translator, a mirrored PMOS switch circuit 10, for translating input signals Vin and Vin/ having a small logic swing to output signals Vout and Vout/ having a large logic swing. Mirrored PMOS switch circuit 10 includes a bias stage (12a and 12b) having PMOS devices P12 and P18 and NMOS devices N12 and N18 and a switching stage 14 having PMOS devices P14 and P16 and NMOS devices N14 and N16. PMOS devices P12, P14, P16 and P18 receive input signals Vin and Vin/which are the output signals from a small logic swing circuit such as a CML or an ECL circuit. Output signals of mirrored PMOS switch circuit 10, Vout and Vout/, are connected to the drain of P16 and the drain of P14, respectively. It should be noted that a signal named XXX/ is a complimentary signal of XXX. For example, Vin/ is complimentary of Vin.

PMOS devices P12, P14, P16 and P18 operate in common source mode and switch complimentary currents into NMOS devices N12, N14, N16 and N18 connected to PMOS devices P12, P16, P14 and P18, respectively.

The operation of mirrored PMOS switch circuit 10 is illustrated below. If Vin is high and Vin/ is low, then P12 and P14 are off, and P16 and P18 are on. The current that flows through P18 flows through N18 and is mirrored to N16. While P14 is off, the current through N16 pulls the drain of N16 low. Thus, Vout/ is low. Since P12 is off, the current that flows through N12 is insignificant, and so is the current through N14. Since P16 is on, the drain of P16 is pulled high, and thus Vout is high.

To provide increased output drive capability at Vout and Vout/, the NMOS devices in the switching stage (N16, and N14) are usually scaled much larger than the devices in the bias stage (P12, N12, P18 and N18). By having N14 larger than N12 and N16 larger than N18, current multiplication can occur across the current-mirror interface from the bias stage to the switching stage (i.e., from N12 to N14 and from N18 to N16). The relative sizes may be characterized by a ratio of the two transistors channel widths (with the channel lengths of the two transistors' being the same). Although various ratios may be used, a typical device ratio for optimum operation is typically 1:4. Thus, for a ratio of 1:4, the device size (e.g. channel width) of N14 or N16 is four times that of P12 or P18. For this same ratio, the device size of N14 or N16 is also four times that of N12 or N18. This allows the current in the bias stage to be minimum while maximizing the current in the switching stage. The device size ratio will not typically be much larger than 1:4 because as the devices in the switching stage become large, the capacitance at node 12 or 18 and at nodes "a" and "b" increases. If the capacitance becomes too large, then node 12 or 18 may not be charged or discharged quickly enough to switch PMOS device P14 or P16 and nodes "a" and "b" may not be charged and discharged quickly enough to switch the currents in N14 or N16.

Mirrored PMOS switch circuit 10 of FIG. 1 has several disadvantages. First, if mirrored PMOS switch circuit 10 is used to translate a CML signal having a small logic swing to a signal having a large logic swing compatible with CMOS or TTL voltage levels, then a separate level shifter stage is required. PMOS devices P12, P14, P16 and P18 typically need at least about a volt across the gate and the source to conduct. Without a sufficient gate bias, PMOS devices P12, P14, P16 and P18 are not effective as switches. When the gate bias is not sufficient, PMOS devices P12, P14, P16 and P18 operate in a low gate voltage current source mode (i.e., in a linear region) even when they are on.

Because a CML circuit outputs voltages between Vcc and Vcc–0.4 V, if the signal from the CML circuit is directly connected to node 12 or 18, it does not provide enough voltage to turn on PMOS device P12, P14, P16 or P18. Therefore, mirrored PMOS switch circuit 10 requires a pair of level shifters. Each level shifter having an NPN transistor and a current source can be placed in parallel with its corresponding branch of the bias stage (12a or 12b). Node 12 can be connected to a node between the emitter of the NPN transistor and the current source of the first level shifter, and node 18 can be connected to a node between the emitter of the NPN transistor and the current source of the second level shifter.

Second, the operation of mirrored PMOS switch circuit 10 is strongly dependent on the PMOS device threshold voltage ($V_T$) which is a function of the semiconductor manufacturing process and the circuit's operating temperature. To turn on a PMOS device, the input voltage must drop below $V_T$ relative to Vcc. In that instance, when the absolute value of Vin–Vcc or Vin/–Vcc is greater than 1 V, the PMOS devices connected to Vin or Vin/, respectively, turn on. When PMOS device P14 turns on, Vout/ becomes high. When PMOS device P16 turns on, Vout becomes high. On the other hand, when the absolute value of Vin–Vcc or Vin/–Vcc is less than 1 V, the PMOS devices connected to Vin or Vin/, respectively, do not turn on.

$V_T$ may vary due to process variations—that is, variations in the semiconductor manufacturing process. Process characteristics may change among different integrated circuits (ICs), including mirrored PMOS switch circuits, if they are manufactured in different lots, if they are from different wafers in the same lot or if they are from different places across a given wafer. Because of the changes in the process, PMOS devices of a first mirrored PMOS switch circuit on one IC chip may have VT's that are substantially different from those of a second mirrored PMOS switch circuit on another IC chip although the $V_T$'s of the PMOS devices in a given mirrored PMOS switch circuit are approximately the same since the devices are located in close proximity of each other and are from the same wafer. For example, the first mirrored PMOS switch circuit may have $V_T$'s at 0.8 V. The second mirrored PMOS switch circuit may have PMOS $V_T$'s at 1.0 V. If Vin–Vcc is 0.9 V, then while PMOS devices P12 and P14 of the first mirrored PMOS switch circuit turn on, PMOS devices P12 and P14 of the second mirrored PMOS switch circuit do not turn on. The term "turn on" is intended in a relative sense to describe the current in the device in question.

Finally, mirrored PMOS switch circuit 10 consumes a large amount of power. The devices in the bias stage can be scaled smaller than the devices in the switching stage to minimize power consumption. Nevertheless, to compensate for process variations and temperature variations (e.g. the changing of VT and gm with temperature), the overall current of mirrored PMOS switch circuit 10 needs to be high, resulting in high power consumption.

Now referring to FIG. 2, a biased inverter 20 is another prior art translator. Biased inverter 20 includes NPN emitter follower transistors T22, T24, T26 and T28 and complimentary input inverters P24, N24, P26 and N26 operating in mid-point bias condition which drive cross-coupled complimentary output inverters P22, N22, P28 and N28.

Bias inverter 20 of FIG. 2 has higher speed performance than mirrored PMOS switch circuit 10 of FIG. 1 and is less sensitive to temperature and process variance since the complimentary output inverters P22, N22, P28 and N28 are being constantly operated just around their input switching threshold as determined by the complimentary input inverters P24, N24, P26 and N26. Ideally, the devices of the complimentary input inverters are much smaller than those of the complimentary output inverters since most of the current in the complimentary input inverters is not used for switching but rather for generating a bias voltage. For optimum performance, the devices of the complimentary input inverters should match those of the complimentary output inverters (e.g., P24/N24=P28/N28, P26/N26=P22/N22) as close as possible so that the threshold voltages track.

The disadvantage of biased inverter 20 of FIG. 2 is that it also consumes a large amount of power. Biased inverter 20 draws significant amounts of static operating current that is a strong function of process, Vcc voltage and temperature. Thus, biased inverter 20 is not useful for power sensitive applications.

It would be advantageous to provide a translator having a reduced power consumption and having switching and drive characteristics that are immune from variations in Vcc voltage, temperature and manufacturing process.

SUMMARY OF THE INVENTION

It is desirable to have a translator circuit that can provide a controlled current in the switching stage of the translator so that the operation of the translator is immune to the variations in manufacturing process, operating temperature and power supply voltage. The present invention provides a translator having a cascode circuit and a bias reference generator so that the drive and switching characteristics of the translator can be optimized for power and performance regardless of the changes in the manufacturing process, threshold voltage, temperature and power supply voltages.

The translator of the present invention includes a bias reference generator that receives a first bias voltage that is in the mid-point of the logic swing of the input voltages and generates a second bias voltage. The second bias voltage is used to bias a cascode circuit so that the cascode circuit has controlled currents.

In one embodiment of the present invention, a translator for translating a signal from a small voltage swing circuit (e.g. CML or ECL circuit) to a signal that is compatible with a large voltage swing circuit (e.g. CMOS or TTL circuit) includes the following components: a bias reference generator for receiving a first bias voltage and generating a second bias voltage; an input circuit for receiving at least a first input signal; a cascode circuit, coupled to the input circuit and to the bias reference generator, for receiving the second bias voltage, having a controlled current and outputting at least a first output signal; and a current-mirror circuit coupled to the cascode circuit.

The bias reference generator may have an NPN transistor, a PMOS device and a current source. The NPN transistor receives the first bias voltage that is in the mid-point of the logic swing of the input voltages. The PMOS device generates the second bias voltage for biasing the cascode circuit. The input circuit may be emitter followers having two NPN transistors receiving the first input signal and two other NPN transistors receiving a second input signal which is complementary of the first input signal.

The cascode circuit may include four PMOS devices each having its gate coupled to the PMOS device of the bias reference generator to receive the second bias voltage. The current-mirror circuit may include two current-mirrors each having two NMOS devices.

According to the present invention, a method for translating at least a first signal having a first voltage level to a second signal having a second voltage level includes the following steps: receiving a first bias voltage that is substantially in the mid-point of the logic swing of the first signal; providing a second bias voltage to a cascode circuit for producing a controlled current in the cascode circuit; receiving the first signal as an input; switching the cascode circuit; and producing the second signal as an output.

BRIEF DESCRIPTION OF THE DRAWINGS

The objects, features and advantages of the present invention will be apparent from the following detailed description in which.

DETAILED DESCRIPTION OF THE INVENTION

The present invention provides a translator having a cascode circuit and a bias reference generator to allow controlled currents to be switched in the switching stage of the translator so that better optimization of power and performance can be achieved over process, Vcc and temperature variance. In the following detailed description, numerous specific details are set forth such as particular circuit schematics and devices in order to provide a thorough understanding of the present invention. It will be appreciated, however, by one having ordinary skill in the art that the present invention may be practiced without such specific details. In other instances, well-known circuits, methods and the like are not set forth in detail to avoid unnecessarily obscuring the present invention.

Figure 1:
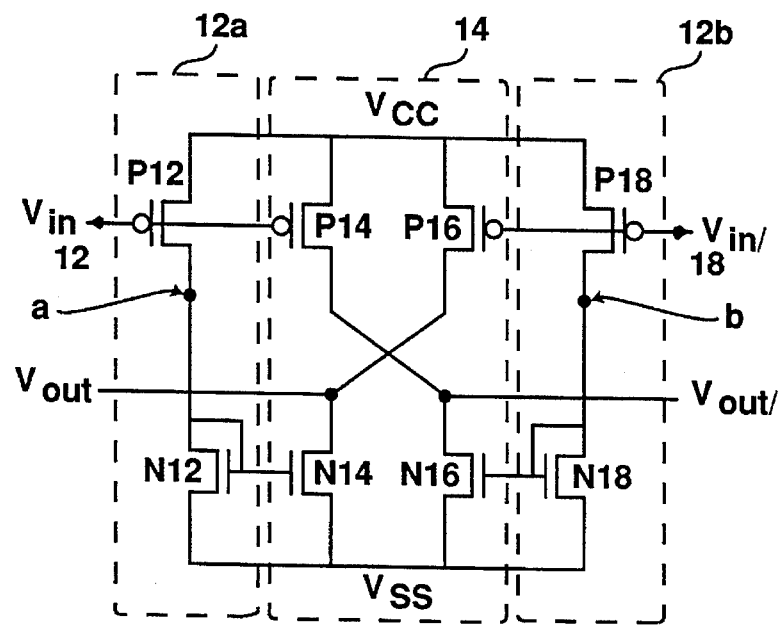
FIG. 1 presents a prior art CML/ECL to CMOS/TTL translator, referred to as a mirrored PMOS switch circuit.
Figure 2:
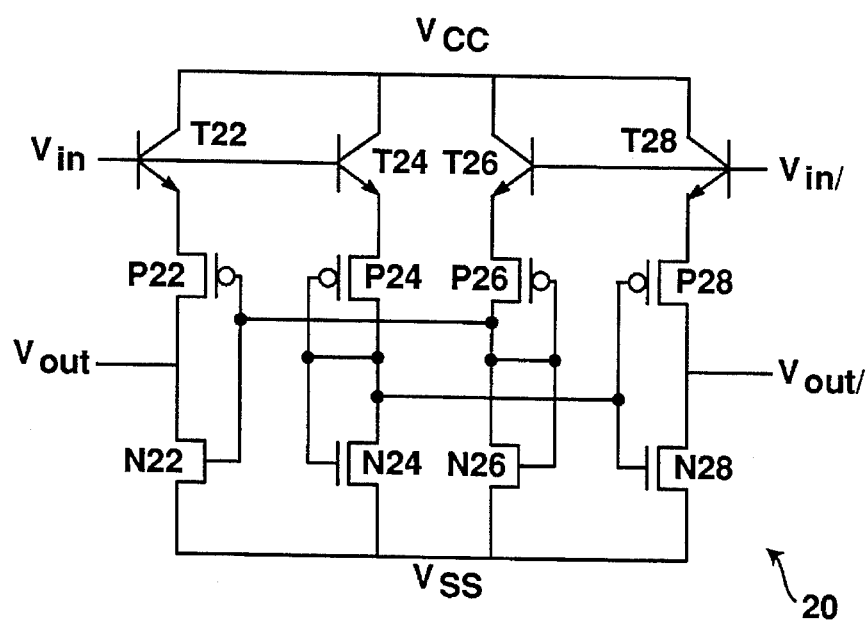
FIG. 2 presents another prior art CML/ECL to CMOS/TTL translator, referred to as a biased inverter translator.
Figure 3:
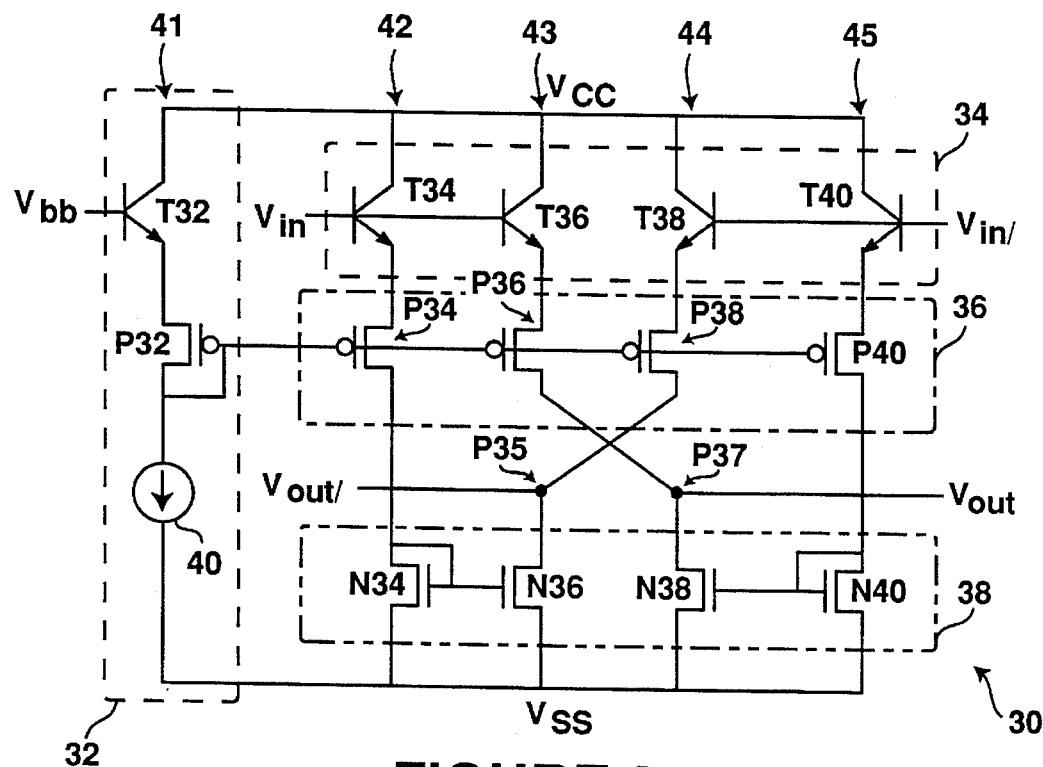
FIG. 3 is a circuit schematic of a CML/ECL to CMOS/TTL translator according to one embodiment of the present invention.

Now referring to FIG. 3, a circuit schematic of the present invention according to one embodiment is presented. A translator 30 in FIG. 3 includes a bias reference generator 32, an emitter follower circuit 34, a cascode circuit 36 and a current-mirror circuit 38. Emitter follower circuit 34 includes four NPN transistors T34, T36, T38 and T40. Transistors T34, T36, T38 and T40 operate in common collector mode and form an input circuit for receiving complimentary input signals Vin and Vin/ from a small logic swing circuit such as a CML/ECL circuit. Transistors T34 and T36 receive input signal Vin from the CML/ECL circuit. Transistors T38 and T40 receive complimentary input signal Vin/from the CML/ECL circuit. Each of the NPN transistors of emitter follower circuit 34 has its collector connected to Vcc and its emitter connected to cascode circuit 36.

Figure 4:
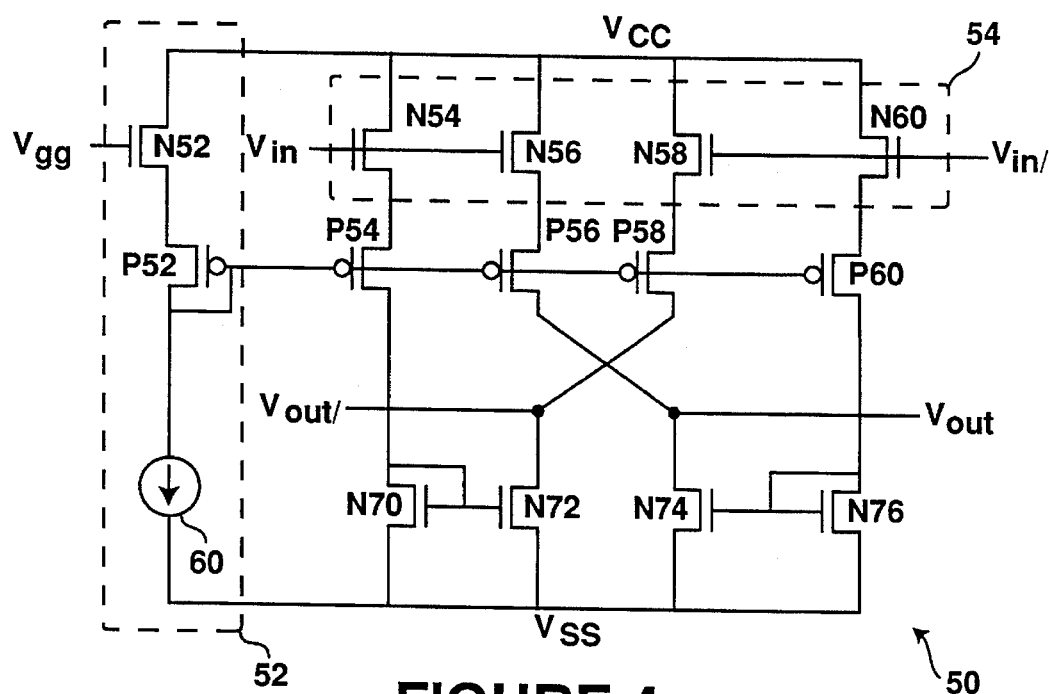
FIG. 4 is a circuit schematic of a CML/ECL to CMOS/TTL translator according to a second embodiment of the present invention.
Figure 5:
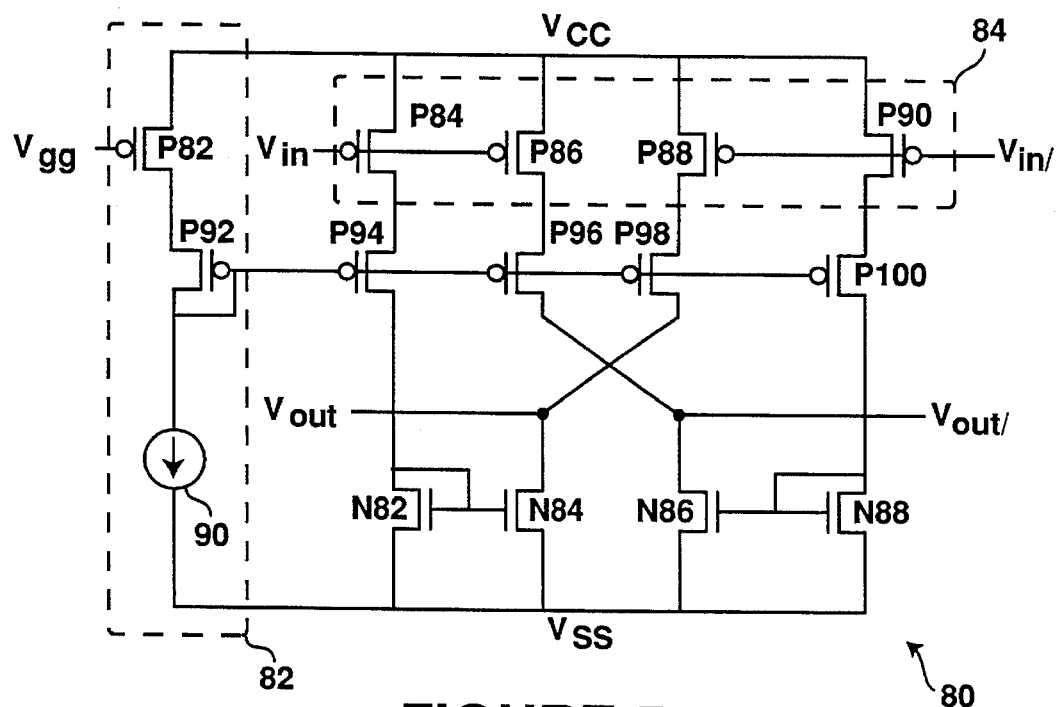
FIG. 5 is a circuit schematic of a CML/ECL to CMOS/TTL translator according to a third embodiment of the present invention.

Emitter follower circuit 34 may be replaced by a source follower circuit 54 in FIG. 4 according to a second embodiment or a common source circuit 84 shown in FIG. 5 according to a third embodiment. Although emitter follower circuit 34 of FIG. 3 can be replaced by source follower circuit 54 in FIG. 4 or common source circuit 84 in FIG. 5, NPN transistors T34, T36, T38 and T40 of emitter follower circuit 34 are preferred over NMOS transistors or PMOS transistors in FIG. 4 or FIG. 5 respectively because NPN transistors have the capability to drive much larger current and can isolate the Vcc sensitivity.

Cascode circuit 36 includes four PMOS devices P34, P36, P38 and P40. Each of the PMOS devices has its gate connected in common to a gate of a PMOS device P32 of bias reference generator 32, its source connected to an emitter of a corresponding NPN transistor of emitter follower circuit 34, and its drain connected to a drain of a corresponding NMOS device of current-mirror circuit 38. The drain of P36 and the drain of P38 are cross-coupled so that Vout is connected to the drain of PMOS device P36 at node 37, and Vout/ is connected to the drain of PMOS device P38 at node 35.

Bias reference generator 32 includes an NPN transistor T32, a PMOS device P32 and a current source 40. Bias reference generator 32 is designed to match the characteristics of the devices in emitter follower circuit 34 and the devices in cascode circuit 36 with the input signals to generate a controlled current in a switching stage including T36, P36, N36, T38, P38 and N38 over all conditions, allowing better optimization of the operating current and thus better performance for a given operating current. NPN transistors T34, T36, T38 and T40 of emitter follower circuit 34 are of the same size, and NPN transistor T40 is typically of the same size as an NPN transistor in emitter follower circuit 34. PMOS device P40 is typically the same size as PMOS device P34.

Current mirror circuit 38 includes NMOS devices N34, N36, N38 and N40. The current in NMOS device N34 is mirrored to NMOS device N36, and the current in NMOS device N40 is mirrored to NMOS device N38.

To operate translator 30 independent of the variations in power supply voltages (Vcc and Vss), manufacturing process and operating temperature, the present invention provides a first bias voltage Vbb to NPN transistor T32 where Vbb is centered at the mid-point of the logic swing of Vin and Vin/. The present invention also provides a cascode circuit 36 having all of the gates connected to the gate of PMOS device P32 so that bias reference generator 32 can produce a controlled current in the switching stage (T36, P36, N36, T38, P38 and N38). Because bias reference generator 32, the switching stage (T36, P36, N36, T38, P38 and N38) and the bias stage (T34, P34, N34, T40, P40 and N40) share the same Vcc and Vss, when Vcc or Vss varies, bias reference generator 32 can generate an appropriate bias voltage to the common gate of cascode circuit 36. In addition, when the threshold voltages of PMOS devices in cascode 36 change (e.g., due to process or temperature variations), the threshold voltage of PMOS device P32 changes in the same manner because the PMOS devices are located in close proximity of each other on the same IC chip, and thus, the bias voltage applied to the common gate of cascode circuit 36 can be adjusted properly to compensate for the changes in the threshold voltage. Therefore, in the present invention, when the power supply voltages or the threshold voltages change, because bias reference generator 32 can provide an appropriate bias voltage and thus a controlled current in the switching stage, Vin or Vin/ does not need to be changed, and translator 30 operates independent of the variations in the power supply voltages or the threshold voltages.

In operation, Vbb is set to the mid-point of the logic swing of Vin and Vin/. At an equilibrium condition (i.e., when Vin and Vin/ are at the mid-point of the logic swing), the current through the branch 42 (a first branch of the bias stage) is equal to the current through the branch 45 (a second branch of the bias stage). Also, the current through the branch 43 (a first branch of the switching stage) equals the current through the branch 44 (a second branch of the switching stage). When Vin becomes high and Vin/ becomes low, the gate-to-source voltages of PMOS devices P34 and P36 increase while the gate-to-source voltages of PMOS devices P38 and P40 decrease. Thus, the current through P34 and the current through P36 increase while the current through P38 and the current through P40 decrease. While PMOS device P36 conducts, PMOS device P38 turns off. The current in NMOS device N34 is mirrored to NMOS device N36, and the node 35 is pulled down by NMOS device N36 while node 37 is pulled up by PMOS device P36. Thus, Vout becomes high and Vout/ becomes low. When Vin is low and Vin/ is high, the opposite phenomena occurs.

To minimize power consumption while allowing high speed switching, the PMOS and NMOS devices in the switching stage are made larger than the PMOS and NMOS devices in the bias stage, and the PMOS devices in the bias stage are made larger than PMOS device P32 in bias reference generator 32. For example, PMOS devices P34 and P40 of cascode circuit 36 may be made to be twice as large as PMOS device P32, and PMOS devices P36 and P38 may be made four times as large as PMOS device P34 or P40. In that instance, NMOS devices N34, N40, N36 and N38 will be also sized such that the sizes of NMOS devices N36 and N38 are four times the device size of NMOS device N34 or N40. Such device sizing scheme is beneficial in reducing the amount of power consumed in bias reference generator 32 and in the bias stage (T34, P34, N34, T40, P40 and N40) while allowing the majority of the current to flow in the switching stage (T36, P36, N36, T38, P38 and N38).

In the present invention, because cascode circuit 36 has common gates, and bias reference generator 32 has Vbb centered at the mid-point of the logic swing of Vin or Vin/, controlled currents can be switched in the switching stage of translator 30 for better optimization of power and performance over process and temperature variance.

The current source 40 may be a known current source, typically implemented with a transistor device, which sources a relatively constant current over variations in Vcc, temperature and process variations. The current source 40 can be designed to compensate for design performance requirements of the translator.

FIG. 4 presents a translator of the present invention according to a second embodiment. Translator 50 of FIG. 4 is similar to translator 30 of FIG. 3 except that translator 50 includes a source follower circuit 54 instead of an emitter follower circuit. One advantage of translator 50 is that translator 50 can be fabricated using a CMOS process rather than a BiCMOS process. However, in FIG. 4, NMOS devices N54, N56, N58 and N60 of source follower circuit 54 may need to be sized much larger than the other PMOS or NMOS devices in translator 50 to ensure proper switching.

Now referring to FIG. 5, a translator 80 is shown according to a third embodiment of the present invention. Translator 80 is similar to translator 30 of FIG. 3 except that translator 80 has a common source switching circuit 84 instead of an emitter follower circuit. Common source switching circuit 84 includes PMOS transistors P84, P86, P88 and P90. Translator 80 operates in a similar matter as translator 30 of FIG. 3. However, like translator 50 of FIG. 4, the PMOS devices of common source switching circuit 84 need to be large to be able to drive a great amount of current.

Figure 6:
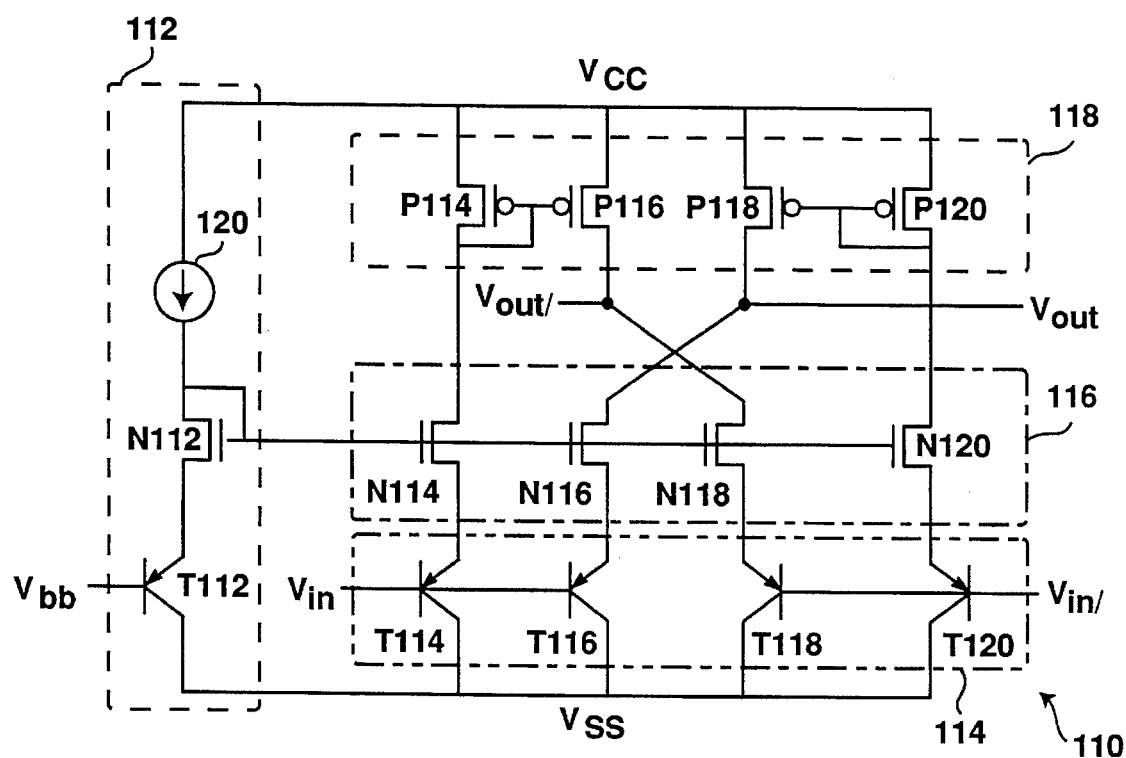
FIG. 6 is a circuit schematic of a CML/ECL to CMOS/TTL translator according to a fourth embodiment of the present invention.

In FIG. 6, a translator 110 is presented according to a fourth embodiment of the present invention. Translator 110 is a complimentary reflection of translator 30 in FIG. 3. Translator 110 has a bias reference generator 112, an emitter follower circuit 114, a cascode circuit 116 and a current-mirror circuit 118. Bias reference generator 112 includes a PNP transistor T112, an NMOS device N112 and a current source 120. Emitter follower circuit 114 includes four PNP transistors T114, T118, T118 and T120. Cascode circuit 116 includes four NMOS devices N114, N116, N118 and N120. Current-mirror circuit 118 includes four PMOS devices P114, P116, P118 and P120. Translator 110 of FIG. 6 operates in a similar manner as translator 30 of FIG. 3.

It should be noted that any of the translators shown in FIGS. 3, 4, 5 and 6 can be modified by introducing a complimentary reflection of the devices in them or by replacing NMOS devices with PMOS devices, NPN transistors with PNP transistors, MOSFET devices with bipolar transistors or bipolar transistors with MOSFET devices.

In the present invention, a bias reference generator such as bias reference generator 32, 52, 82 or 112 is provided to produce a controlled current in the switching stage that is immune to Vcc, temperature, or process variance. However, a bias reference generator can be provided that tracks Vcc, temperature or threshold voltage variance and varies the current in the switching stage according to any of the parameters stated above.

While the present invention has been particularly described with reference to the various figures and embodiments, it should be understood that these are for illustration only and should not be taken as limiting the scope of the invention. Many changes and modifications may be made to the invention, by one having ordinary skill in the art, without departing from the spirit and scope of the invention.

What is claimed is:

1. A translating circuit for translating at least a first input signal having a first input voltage level to a first output signal having a first output voltage level, said translating circuit comprising:

a bias reference generator having a first transistor, a second transistor and a current source, wherein said first transistor receives a bias signal having a voltage centered substantially at the mid-point of the logic swing of said first input signal and said bias reference generator generating a bias voltage;

an input circuit receiving said first input signal;

a cascode circuit having a plurality of transistors each having its input node coupled to each other, wherein said cascode circuit is coupled to said input circuit and to said bias reference generator, said cascode circuit receiving said bias voltage, having a controlled current and outputting said first output signal; and a current-mirror circuit coupled to said cascode circuit.

2. A translating circuit according to claim 1 wherein said second transistor and said plurality of transistors in said cascode circuit are in a current-mirror arrangement.

3. A translating circuit according to claim 1 wherein said first input signal has a first logic swing, and said first output signal has a second logic swing wherein said second logic swing is greater than said first logic swing.

4. A translating circuit according to claim 1 wherein said first input signal is from a current-mode logic (CML) voltage level or from an emitter-coupled logic (ECL) voltage level, and said first output signal is at a complementary metal oxide semiconductor (CMOS) voltage level or at a transistor-transistor logic (TTL) voltage level.

5. A translating circuit for translating at least a first input signal having a first input voltage level to a first output signal having a first output voltage level, said translating circuit comprising:

a bias reference generator generating a bias voltage;

an input circuit receiving said first input signal;

a cascode circuit coupled to said input circuit and to said bias reference generator, said Cascode circuit receiving said bias voltage, having a controlled current and outputting said first output signal, wherein said cascode circuit has its output nodes cross-coupled; and a current-mirror circuit coupled to said cascode circuit.

6. A translating circuit for translating at least a first input signal having a first input voltage level to a first output signal having a first output voltage level, said translating circuit comprising:

a bias reference generator generating a bias voltage;

an input circuit receiving said first input signal;

a cascode circuit coupled to said input circuit and to said bias reference generator, said cascode circuit receiving said bias voltage, having a controlled current and outputting said first output signal, wherein said cascode circuit includes a first, a second, a third and a fourth metal oxide semiconductor field effect transistors (MOSFETs) wherein each of said first, second, third and fourth MOSFETs has its gate coupled to each other; and a current-mirror circuit coupled to said cascode circuit.

7. A translating circuit according to claim 6 wherein said current-mirror circuit includes a fifth, sixth, seventh and eighth MOSFETs wherein said fifth MOSFET has its gate and drain coupled to a drain of said first MOSFET and its source for coupling to a first power supply voltage level;

said sixth MOSFET has its gate coupled to said gate of said fifth MOSFET, its drain coupled to a drain of said third MOSFET, and its source for coupling to said first power supply voltage level;

said seventh MOSFET has its gate coupled to a gate of said eighth MOSFET, its drain coupled to a drain of said second MOSFET, and its source for coupling to said first power supply voltage level; and said eighth MOSFET has its gate and drain coupled to a drain of said fourth MOSFET and its source for coupling to said first power supply voltage level wherein said drain of said third MOSFET outputs said first output signal, and said drain of said second MOSFET outputs a second output signal.

8. A translating circuit according to claim 7 wherein said bias reference generator has a first transistor, a ninth MOSFET and a current source wherein said ninth MOSFET has its gate and drain coupled to the gate of said first MOSFET and to said current source; and said current source is for coupling to said first power supply voltage level.

9. A translating circuit according to claim 8 wherein said input circuit is an emitter follower circuit that includes a first, a second, a third and a fourth bipolar transistors wherein said first bipolar transistor has its base for coupling to said first input signal, its collector for coupling to a second power supply voltage level, its emitter coupled to a source of said first MOSFET;

said second bipolar transistor has its base for coupling to said first input signal, its collector for coupling to said second power supply voltage level, and its emitter coupled to a source of said second MOSFET;

said third bipolar transistor has its base for coupling to a second input signal, its collector for coupling to said second power supply voltage level, and its emitter coupled to a source of said third MOSFET;

said fourth bipolar transistor has its base for coupling to said second input signal, its collector for coupling to said second power supply voltage level, and its emitter coupled to a source of said fourth MOSFET;

said first transistor has its base for coupling to a bias signal, its collector for coupling to said second power supply voltage level; and said ninth MOSFET has its source coupled to an emitter of said first transistor.

10. A translating circuit according to claim 8 wherein said input circuit includes a tenth, an eleventh, a twelfth and a thirteenth MOSFETs wherein if said tenth, eleventh, twelfth and thirteenth MOSFETs and said first transistor are n-channel MOSFETs, then said tenth MOSFET has its gate for coupling to said first input signal, its drain for coupling to a second power supply voltage level, its source coupled to a source of said first MOSFET;

said eleventh MOSFET has its gate for coupling to said first input signal, its drain for coupling to said second power supply voltage level, and its source coupled to a source of said second MOSFET;

said twelfth MOSFET has its gate for coupling to a second input signal, its drain for coupling to said second power supply voltage level, and its source coupled to a source of said third MOSFET;

said thirteenth MOSFET has its gate for coupling to said second input signal, its drain for coupling to said second power supply voltage level, and its source coupled to a source of said fourth MOSFET;

said first transistor has its gate for coupling to a bias signal, its drain for coupling to said second power supply voltage level; and said ninth MOSFET has its source coupled to a source of said first transistor and wherein if said tenth, eleventh, twelfth and thirteenth MOSFETs are p-channel MOSFETs, then said tenth MOSFET has its gate for coupling to said first input signal, its source for coupling to a second power supply voltage level, its drain coupled to a source of said first MOSFET;

said eleventh MOSFET has its gate for coupling to said first input signal, its source for coupling to said second power supply voltage level, and its drain coupled to a source of said second MOSFET;

said twelfth MOSFET has its gate for coupling to a second input signal, its source for coupling to said second power supply voltage level, and its drain coupled to a source of said third MOSFET;

said thirteenth MOSFET has its gate for coupling to said second input signal, its source for coupling to said second power supply voltage level, and its drain coupled to a source of said fourth MOSFET;

said first transistor has its gate for coupling to a bias signal, its source for coupling to said second power supply voltage level; and said ninth MOSFET has its source coupled to a drain of said first transistor.

11. A translating circuit for translating at least a first input signal having a first input voltage level to a first output signal having a first output voltage level, said translating circuit comprising:

a bias reference generator generating a bias voltage;

an input circuit receiving said first input signal;

a cascode circuit coupled to said input circuit and to said bias reference generator, said cascode circuit receiving said bias voltage, having a controlled current and outputting said first output signal; and a current-mirror circuit coupled to said cascode circuit;

wherein said translating circuit operates substantially independent of the threshold voltages of the devices in said translating circuit, temperature, power supply voltages provided to said translating circuit, and process characteristics used to manufacture said devices in said translating circuit.

12. A translating circuit for translating at least a first signal having a first voltage level to a second signal having a second voltage level, said translating circuit comprising:

a bias reference generator, generating a bias voltage, having a first transistor, a second transistor and a current source, said first transistor, receives a bias signal having a voltage centered substantially at the mid-point of the logic swing of said first signal;

a bias stage coupled to said bias reference generator, said bias stage receiving said first signal and said bias voltage; and a switching stage coupled to said bias stage and to said bias reference generator, said switching stage receiving said bias voltage and outputting said second signal.

13. A translating circuit according to claim 12 wherein at least one transistor from each of said bias reference generator, said bias stage and said switching stage is coupled to one another.

14. A method for translating at least a first signal having a first voltage level to a second signal having a second voltage level, said method comprising:

receiving a first bias voltage that is substantially in the mid-point of the logic swing of said first signal;

providing a second bias voltage to a cascode circuit for producing a controlled current in said cascode circuit;

receiving said first signal; and producing said second signal.

15. A method according to claim 14 further comprising:

switching said cascode circuit after the step of receiving said first signal wherein the logic swing of said first signal is less than the logic swing of said second signal.

16. A method according to claim 14 further comprising:

shifting the voltage level of said first signal after the step of receiving said first signal;

receiving a third signal simultaneously with the step of receiving said first signal; and producing a fourth signal simultaneously with the step of producing said second signal.

17. A method according to claim 14 wherein said first signal is from a current-mode logic (CML) voltage level or from an emitter-coupled logic (ECL) voltage level, and said second signal is at a complementary metal oxide semiconductor (CMOS) voltage level or at a transistor-transistor logic (TTL) voltage level.

* * * * *